(12) United States Patent
Washiro

(10) Patent No.: US 8,963,749 B2
(45) Date of Patent: Feb. 24, 2015

(54) FIELDBUS ADAPTER AND METHOD OF USING FIELDBUS ADAPTER

(75) Inventor: Mitsuhiro Washiro, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 13/556,371

(22) Filed: Jul. 24, 2012

(65) Prior Publication Data

US 2013/0027237 A1    Jan. 31, 2013

(30) Foreign Application Priority Data

Jul. 28, 2011  (JP) .................................. 2011-165408

(51) Int. Cl.
*H03M 1/02* (2006.01)
*G05B 19/042* (2006.01)

(52) U.S. Cl.
CPC ............. *G05B 19/0423* (2013.01); *H03M 1/02* (2013.01)
USPC ......................................... 341/108; 341/110

(58) Field of Classification Search
CPC ..... H03M 1/00; H03M 2201/13; H03M 1/02; H03M 2201/17
USPC ................................................ 341/108, 110
See application file for complete search history.

(56) References Cited

U.S. PATENT DOCUMENTS

| 6,516,672 | B2 * | 2/2003 | Wang ............................... 73/718 |
| 8,643,523 | B1 * | 2/2014 | Shepherd et al. ............. 341/141 |
| 2002/0010562 | A1 * | 1/2002 | Schleiss et al. ............... 702/183 |
| 2003/0236579 | A1 * | 12/2003 | Hauhia et al. ................... 700/79 |
| 2006/0143469 | A1 * | 6/2006 | Schmidt et al. ............... 713/186 |
| 2009/0228611 | A1 | 9/2009 | Ferguson et al. |
| 2010/0149997 | A1 * | 6/2010 | Law et al. ...................... 370/248 |
| 2010/0259101 | A1 * | 10/2010 | Micallef et al. ................. 307/26 |
| 2011/0037627 | A1 * | 2/2011 | Hermann ...................... 341/116 |
| 2012/0306658 | A1 * | 12/2012 | Karaffa et al. ................ 340/679 |

FOREIGN PATENT DOCUMENTS

| CN | 1926486 A | 3/2007 |
| JP | 03-207196 A | 9/1991 |
| JP | 04-326639 A | 11/1992 |
| JP | 07-115392 A | 5/1995 |
| JP | 2008-129754 A | 6/2008 |
| JP | 2011-513854 A | 4/2011 |
| WO | 2005/086110 A2 | 9/2005 |

* cited by examiner

*Primary Examiner* — Linh Nguyen
(74) *Attorney, Agent, or Firm* — Sughrue Mion, PLLC

(57) ABSTRACT

A fieldbus adaptor connected between a fieldbus that handles a digital signal and a field device that handles an analog signal, the fieldbus adaptor comprising a first connection unit detachably connected to the fieldbus, a second connection unit detachably connected to the field device, and a conversion unit provided between the first connection unit and the second connection unit, the conversion unit bidirectionally converting the digital signal handled by the fieldbus and the analog signal handled by the field device.

11 Claims, 4 Drawing Sheets

FIELDBUS ADAPTER AND METHOD OF USING FIELDBUS ADAPTER

BACKGROUND OF THE INVENTION

1. Field of the Invention

The present invention relates to a fieldbus adapter that is connected between a fieldbus that handles a digital signal and a field device that handles an analog signal.

Priority is claimed on Japanese Patent Application No. 2011-165408, filed Jul. 28, 2011, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Currently, protocols used for a fieldbus include HART, FOUNDATION fieldbus, PROFIBUS, BRAIN, ISA100.11a, etc. HART, BRAIN and the like realize digital input/output while using resources of an analog control system by overlapping a digital signal with an existing analog current output of 4 to 20 mA. In addition, in FOUNDATION fieldbus and ISA100.11a, measurement and calculation functions of devices are connected by using a function block to build an autonomous control system.

When introduction of the autonomous control system of a FOUNDATION fieldbus, ISA100.11a or the like is attempted while using resources of an analog control system, the existing fieldbus of HART, BRAIN or the like is not available since there is no compatibility with the existing fieldbus of HART, BRAIN or the like. Accordingly, resources of the analog control system cannot be incorporated into the autonomous control system.

SUMMARY

The present invention provides a fieldbus adapter that can incorporate an analog-type field device into an autonomous control system.

A fieldbus adaptor connected between a fieldbus that handles a digital signal and a field device that handles an analog signal may include: a first connection unit detachably connected to the fieldbus; a second connection unit detachably connected to the field device; and a conversion unit provided between the first connection unit and the second connection unit, the conversion unit bidirectionally converting the digital signal handled by the fieldbus and the analog signal handled by the field device.

The analog signal may be a signal of 4 to 20 mA.

The fieldbus may be a bus conforming to a FOUNDATION fieldbus.

The conversion unit may include a function block application.

The conversion unit may be capable of supporting field devices conforming to a plurality of standards.

The fieldbus adaptor may further include: a protocol stack conforming to one of FF H1 bus and HSE bus corresponding to the fieldbus; and a VFD (Virtual Field Device) object conforming to a FF standard specification, the VFD object including a function block application that includes an AI block and an AO block that are function blocks conforming to the FF standard specification.

When a PV (Primary Value) of the field device is output to the fieldbus, the conversion unit may read the PV of the field device, which is an analog signal of 4 to 20 mA, and converts the PV into a digital value. The digital value may be input to the AI block of the function block application. Digital data that may be a calculation result in the AI block is output to the fieldbus via the protocol stack. The digital data may be input to other field devices or a manipulation monitoring apparatus and used.

Digital data, which is output from the other field devices or the manipulation monitoring apparatus to the fieldbus, may be input to the AO block of the function block application via the protocol stack. A calculation result in the AO block may be converted into an analog value by the conversion unit and input to the field device.

Settings necessary for handling the field device as an FF fieldbus device may be carried out by using a method conforming to the FF standard specification through the protocol stack.

A method of incorporating an analog-type field device into an autonomous control system may include: reading a PV (Primary Value) of the analog-type field device; converting the PV into a digital value; calculating digital data based on the digital value; outputting the digital data to a fieldbus; and receiving, by other field devices or a manipulation monitoring apparatus, the digital data from the fieldbus.

The method of incorporating an analog-type field device into an autonomous control system further include: receiving digital data that is output from other field devices or a manipulation monitoring apparatus; calculating a digital value based on the digital data; converting the digital data into an analog value; and receiving, by the analog-type field device, the analog value.

The fieldbus may be a bus conforming to a FOUNDATION fieldbus.

A method of using a fieldbus adapter that is connected between a fieldbus that handles a digital signal and a field device that handles an analog signal may include: connecting a first field device to the fieldbus adapter via a connection unit of the fieldbus adapter; using the first field device, which is connected to the fieldbus, via the fieldbus adapter; detaching the first field device from the fieldbus adapter via the connection unit; connecting a second field device to the fieldbus adapter via the connection unit; and using the second field device, which is connected to the fieldbus, via the fieldbus adapter.

The fieldbus adaptor may include a first connection unit detachably connected to the fieldbus and a second connection unit detachably connected to the field device. The conversion unit may be provided between the first connection unit and the second connection unit. The conversion unit bidirectionally may convert the digital signal handled by the fieldbus and the analog signal handled by the field device.

The analog signal may be a signal of 4 to 20 mA.

The fieldbus may be a bus conforming to a FOUNDATION fieldbus.

The conversion unit may include a function block application.

The conversion unit may be capable of supporting field devices conforming to a plurality of standards.

According to a field adaptor of the present invention, a conversion unit for bidirectionally converting a digital signal handled by a fieldbus and an analog signal handled by a field device is included. Accordingly, it is possible to incorporate an analog-type field device into an autonomous control system.

According to a method of using a field adaptor of the present invention, a conversion unit for bidirectionally converting a digital signal handled by a fieldbus and an analog signal handled by a field device is included. Accordingly, it is possible to incorporate an analog-type field device into an autonomous control system.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

Figure 1:
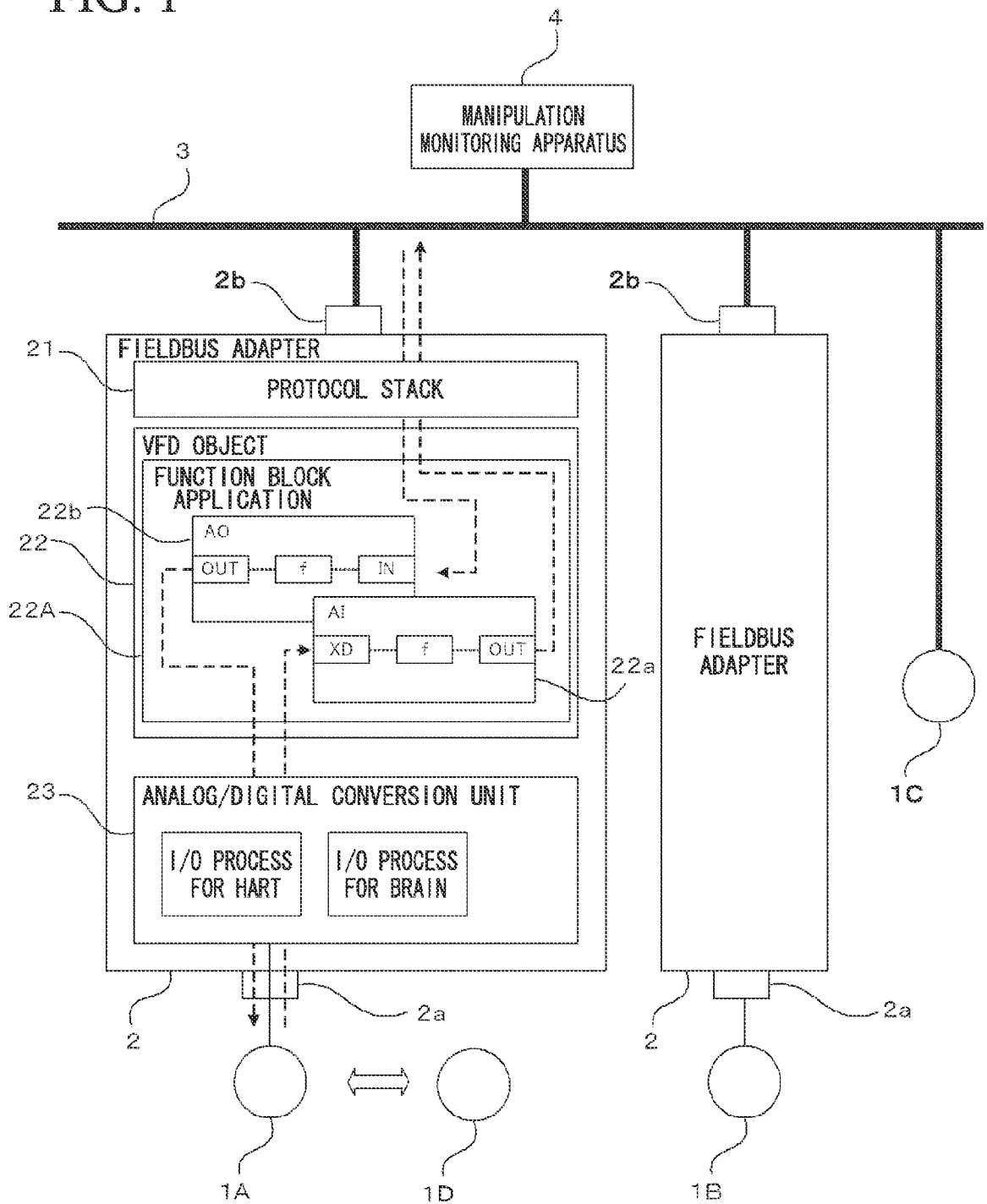
FIG. 1 is a block diagram illustrating a configuration of a field control system using a fieldbus adaptor in accordance with a first preferred embodiment of the present invention.

FIG. 1 is a block diagram illustrating a configuration of a field control system using a fieldbus adaptor in accordance with a first preferred embodiment of the present invention. As shown in FIG. 1, the field control system includes an analog-type field device 1A, an analog-type field device 1B, and a field device 1C that is an FF fieldbus device conforming to a fieldbus protocol of a FOUNDATION fieldbus. That is, the field control system includes multiple formats of field devices.

As shown in FIG. 1, the analog-type field device 1A and the analog-type field device 1B are connected to a bus 3 via a fieldbus adaptor 2. The bus 3 is an FF H1 bus or an HSE bus conforming to a fieldbus protocol of a FOUNDATION fieldbus, which is hereinafter referred to as "FF". The field device 1C, which is an FF fieldbus device, is directly connected to the bus 3.

A manipulation monitoring apparatus 4 is provided on an upper level of a group of the field devices. The manipulation monitoring apparatus 4 performs monitoring of a manipulation of the field device group and maintenance of respective units of the field control system. The manipulation monitoring apparatus 4 is connected to the bus 3.

As shown in FIG. 1, the fieldbus adaptor 2 includes a connection unit 2a to which the field device is connected and a connection unit 2b to which the bus 3 is connected. The connection unit 2a allows a detachable connection of a field device and can change a field device connected to the fieldbus adaptor 2 through connection and detachment operations in the connection unit 2a. Further, the connection unit 2b is detachably connected to the bus 3, and the fieldbus adaptor 2 may be connected to any position of the bus 3 via the connection unit 2b.

As shown in FIG. 1, the fieldbus adaptor 2 includes a protocol stack 21 conforming to FF H1 bus or HSE bus corresponding to the bus 3, a VFD (Virtual Field Device) object 22, and an analog/digital conversion unit 23.

The VFD object 22 conforms to the FF standard specification and includes a function block application 22A. Further, the VFD object 22 includes an NMA-VFD. However, the NMA-VFD is not shown since it is not directly related to the present invention.

As shown in FIG. 1, the function block application 22A includes an AI block 22a and an AO block 22b that are function blocks conforming to the FF standard specification. The function block application 22A may further include a DI block and a DO block that are function blocks conforming to the FF standard specification.

As shown in FIG. 1, the analog/digital conversion unit 23 supports both an I/O process for HART and an I/O process for BRAIN. Accordingly, an analog-type field device conforming to HART or BRAIN is available.

Next, operations of the fieldbus adapter in accordance with the first preferred embodiment of the present invention will be described.

When a PV (Primary Value) of the field device 1A is output to the bus 3, the analog/digital conversion unit 23 reads the PV of the field device 1A, which is an analog signal of 4 to 20 mA, and converts the PV into a digital value. This digital value is input to the AI block 22a of the function block application 22A, and digital data that is a calculation result in the AI block 22a is output to the bus 3 via the protocol stack 21. The digital data is input to other field devices, including the field device 1B and the field device 1C, or the manipulation monitoring apparatus 4 and used.

In addition, digital data output from the other field device or the manipulation monitoring apparatus 4 to the bus 3 is input to the AO block 22b of the function block application 22A via the protocol stack 21. A calculation result in the AO block 22b is converted into an analog value by the analog/digital conversion unit 23 and input to the field device 1A.

Similarly, data output from the field device 1B to the bus 3 and data input from the bus 3 to the field device 1B are executed via a fieldbus adaptor 2 connected between the field device 1B and the bus 3.

Settings necessary for handling the field device 1A or the field device 1B as an FF fieldbus device are carried out by using a method conforming to the FF standard specification through the protocol stack 21.

Figure 2:
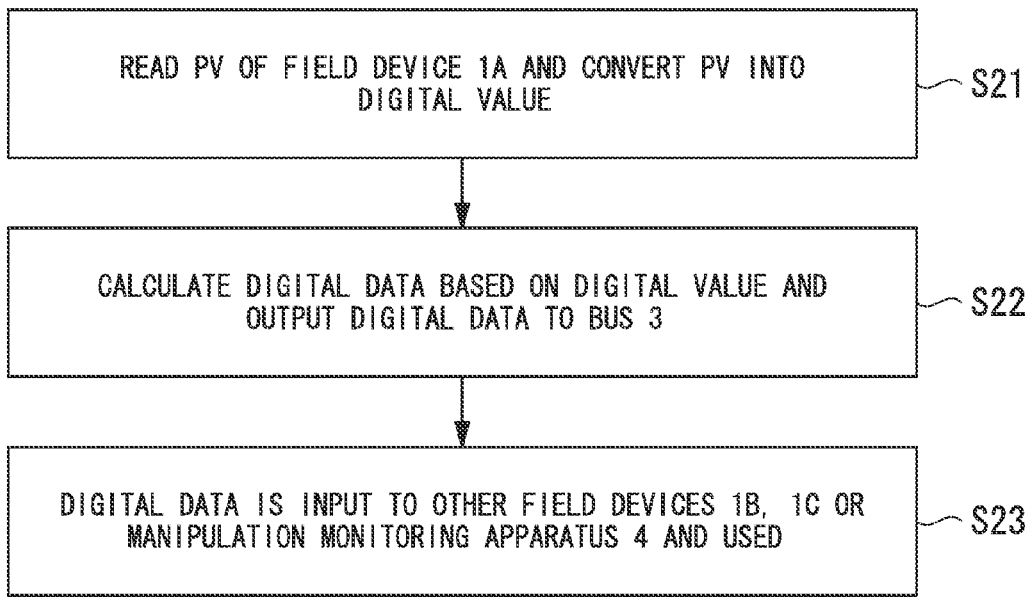
FIG. 2 is a flowchart illustrating an operation of the fieldbus adapter in accordance with the first preferred embodiment of the present invention.

FIG. 2 is a flowchart illustrating an operation of the fieldbus adapter in accordance with the first preferred embodiment of the present invention. In step S21, PV of the field device 1A is read and converted into digital value. Then, in step S22, digital data is calculated based on the digital value and output to the bus 3. Then, in step S23, the digital data is input to other field devices 1B and 1C or the manipulation monitoring apparatus 4 and used.

Figure 3:
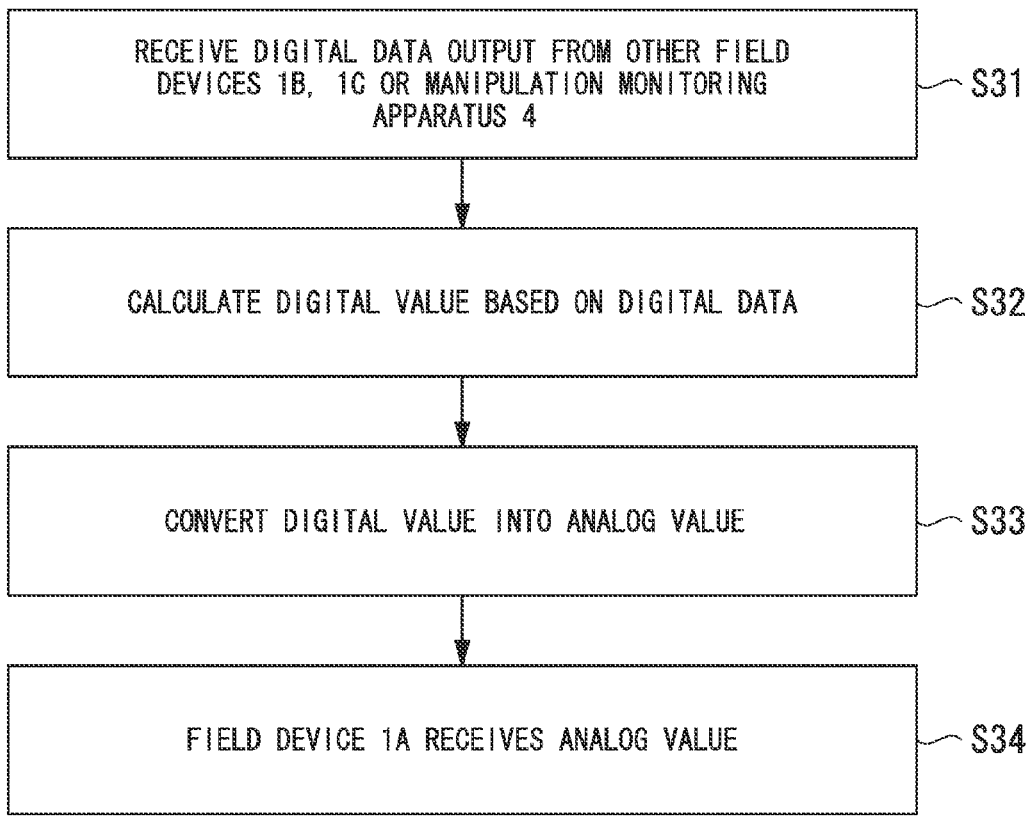
FIG. 3 is a flowchart illustrating an operation of the fieldbus adapter in accordance with the first preferred embodiment of the present invention.

FIG. 3 is a flowchart illustrating an operation of the fieldbus adapter in accordance with the first preferred embodiment of the present invention. In step S31, digital data is input to the bus 3 from other field devices 1B and 1C or the manipulation monitoring apparatus 4. Then, in step S32, digital value is calculated based on the digital data. Then, in step S33, the digital value is converted into analog value. Then, in step S34, the analog value is input to the field device 1A.

As described above, according to the fieldbus adaptor of the present embodiment, the connection of the fieldbus adaptor between the analog-type field device and the bus enables the analog-type field devices to be controlled by the autonomous field control system, similar to the FF fieldbus device.

Further, since the application function block conforms to the FF standard specification, the fieldbus adaptor can be applied to a wide range of models of field devices, and can be caused to function as a converter without needing to manipulate a device parameter specific to the connected field device.

Further, since processing content of the application function block is limited to a data input/output function, versatility of the fieldbus adaptor can be improved. Further, a mounting size can be greatly reduced and resources of, for example, a memory can be saved in comparison with a program of a normal FF fieldbus device.

Further, in order to improve the versatility of the fieldbus adaptor, for example, the field device 1A, which has been used as a field device, is detached from the connection unit 2a and the field device 1D is connected via the connection unit 2a, as shown in FIG. 1. Now, the field device 1D can be handled as an FF fieldbus device. In this case, a model or a function of the field device 1D may differ from that of the field device 1A. Thus, it is possible to utilize the fieldbus adaptor 2 for various field devices and achieve reduction of cost, conservation of hardware resources, or reduction of a burden of engineering work.

Figure 4:
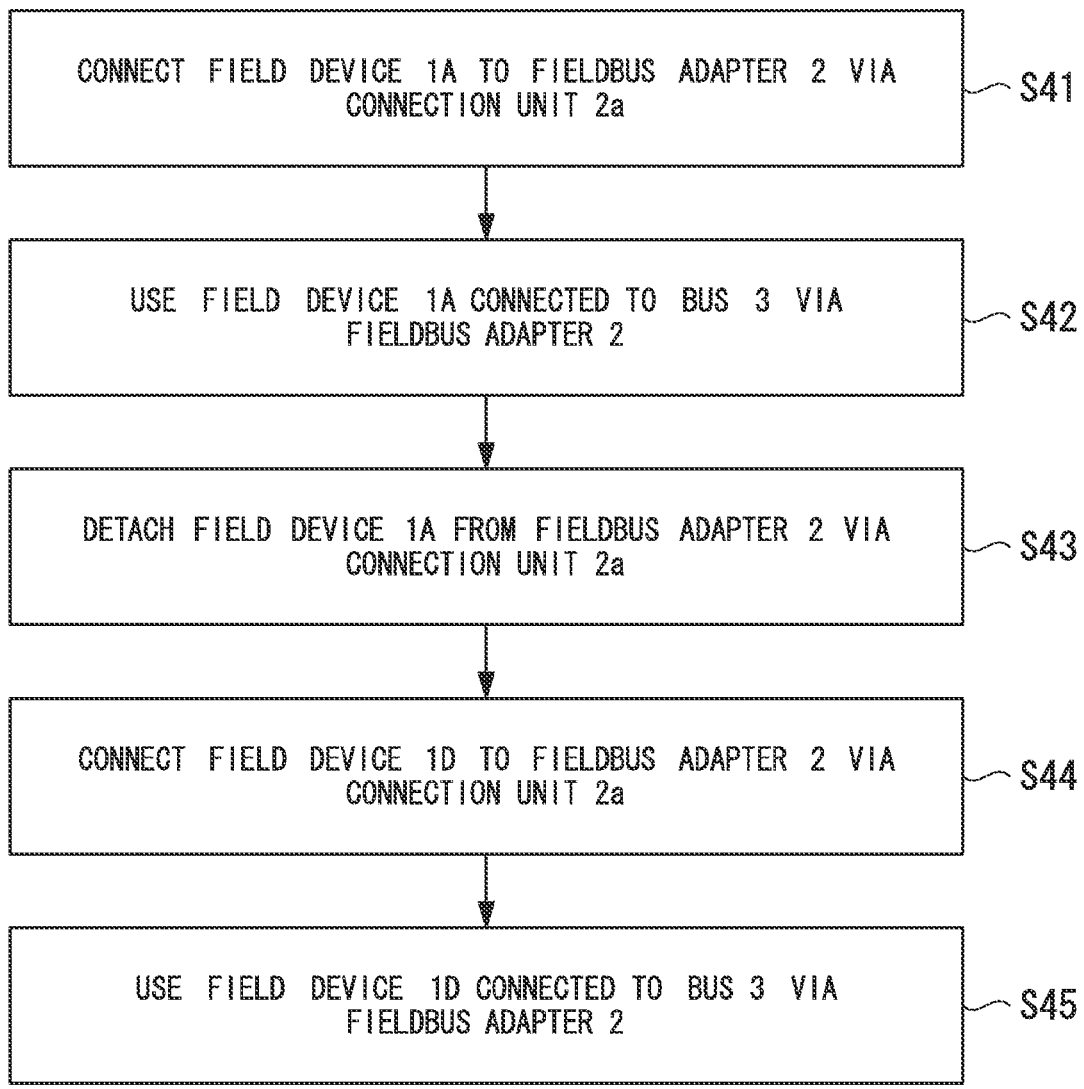
FIG. 4 is a flowchart illustrating an operation of the fieldbus adapter in accordance with the first preferred embodiment of the present invention.

FIG. 4 is a flowchart illustrating an operation of the fieldbus adapter in accordance with the first preferred embodiment of the present invention. In step S41, the field device 1A is connected to the fieldbus adapter 2 via the connection unit 2a. Then, in step S42, the field device 1A is connected to the bus 3 via the fieldbus adapter 2 and used. Then, in step S43, the field device 1A is detached from the fieldbus adapter 2 via the connection unit 2a. Then, in step S44, the field device 1D, which is different from the field device 1A, is connected to the fieldbus adapter 2 via the connection unit 2a. Then, in step S45, the field device 1D is connected to the bus 3 via the fieldbus adapter 2 and used.

Figure 5:
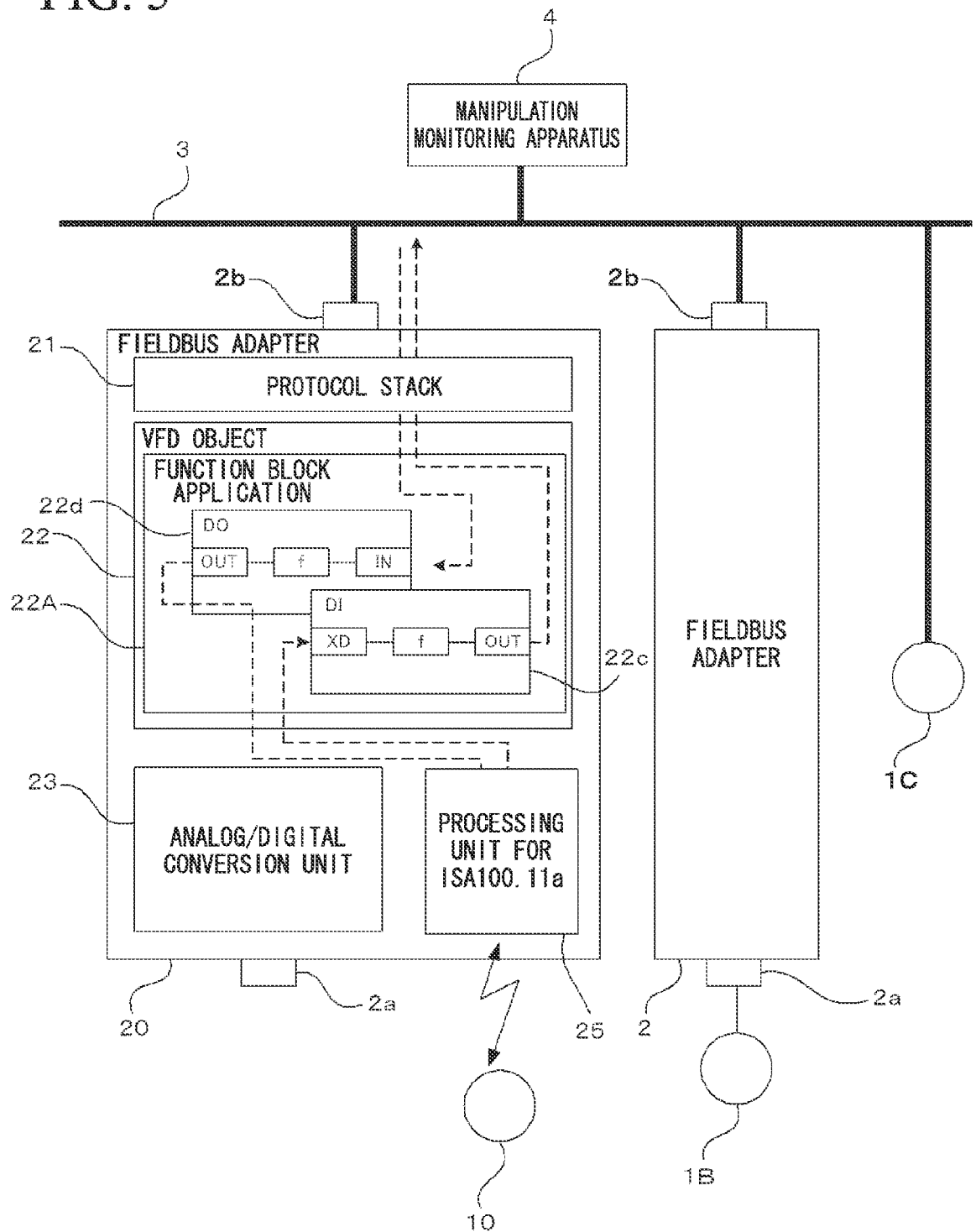
FIG. 5 is a block diagram illustrating an example of a configuration of a fieldbus adaptor capable of supporting a wireless field device in accordance with the first preferred embodiment of the present invention.

FIG. 5 is a block diagram illustrating an example of a configuration of a fieldbus adaptor capable of supporting a wireless field device in accordance with the first preferred embodiment of the present invention. In FIG. 5, the same reference numerals are assigned to the same components as those in FIG. 1.

As shown in FIG. 5, a processing unit 25 for ISA100.11 that executes a process for ISA100.11 is provided in a fieldbus adaptor 20. Accordingly, a wireless field device 10 is connected to a bus 3 via wireless communication between the wireless field device 10 and the processing unit 25 for ISA100.11. In this case, a DI block 22c and a DO block 22d are provided in a function block application 22A. Accordingly, data input/output between the wireless field device 10 and the bus 3 is performed via a protocol stack 21, the function block application 22A, and the processing unit 25 for ISA100.11. An analog/digital conversion unit 23 is not used at the time of such data input/output.

Thus, the processing unit 25 for ISA100.11 is provided in the fieldbus adaptor 20. This enables the wireless field device 10 to be handled as an FF fieldbus device.

While, in the above embodiments, the example in which one VFD object is mounted on the fieldbus adaptor is shown, a plurality of VFD objects may be mounted on the fieldbus adaptor, which enables a plurality of field devices to be connected to the bus 3 by one fieldbus adaptor.

An application scope of the present invention is not limited to the above embodiments. The present invention may be widely applied to a fieldbus adaptor connected between a fieldbus that handles a digital signal and a field device that handles an analog signal.

As used herein, the following directional terms "forward, rearward, above, downward, right, left, vertical, horizontal, below, transverse, row and column" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A fieldbus adaptor comprising:
a first connection unit configured to be detachably connected to a first field device and a second field device, the first and second field devices being analog-type field devices,
a second connection unit directly connected to a third field device conforming to a fieldbus protocol of a FOUNDATION fieldbus (a FF standard specification), the second connection unit being configured to be detachably connected to a fieldbus that is at least one of an FF H1 bus and an HSE bus conforming to the FF standard specification;
a protocol stack conforming to at least one of the FF H1 bus and the HSE bus corresponding to the fieldbus;
a Virtual Field Device (VFD) object conforming to the FF standard specification, the VFD object including an AI block and an AO block that are function blocks conforming to the FF standard specification;
an analog/digital conversion unit provided between the first connection unit and the second connection unit, the analog/digital conversion unit bidirectionally converting a digital signal handled by the fieldbus to an analog signal handled by the first and second field devices and bidirectionally converting the analog signal handled by the first and second field devices to the digital signal handled by the fieldbus, wherein
the analog/digital conversion unit is configured to read a Primary Value (PV) of the first field device, which is the analogue signal, and to convert the PV into a digital value,
the AI block is configured to receive the digital value, which has been converted, and to output digital data, which is a first calculation result in the AI block, to the fieldbus via the protocol stack, the AO block is configured to receive the digital data, which has been output to the fieldbus from other field devices including the third field device or a manipulation monitoring apparatus, via the protocol stack and to output digital data which is a second calculation result in the AO block, the analog/digital conversion unit is configured to receive the digital data which is the second calculation result, to convert the digital data into an analogue value, and to output the analogue value to the first field device, and the analog/digital conversion unit is operative to communicate with and support field devices conforming to different ones of a plurality of standards.

2. The fieldbus adaptor according to claim 1, wherein the analog signal is a signal of 4 to 20 mA.

3. The fieldbus adaptor according to claim 1, wherein the analog/digital conversion unit includes a function block application.

4. The fieldbus adaptor according to claim 1, wherein settings necessary for handling the first field device as an FF fieldbus device are carried out by using a method conforming to the FF standard specification through the protocol stack.

5. The fieldbus adapter according to claim 1, further comprising:

a processing unit for wireless communication that is configured to execute a process for wireless communication and to transmit/receive data to/from a wireless field device by wirelessly communication with the wireless field device.

6. A method of using a fieldbus adapter, the fieldbus adapter including:

a first connection unit configured to be detachably connected to a first field device and a second field device, the first and second field devices being analog-type field devices, a second connection unit directly connected to a third field device conforming to a fieldbus protocol of a FOUNDATION fieldbus (a FF standard specification), the second connection unit being configured to be detachably connected to a fieldbus that is at least one of an FF H1 bus and an HSE bus conforming to the FF standard specification;

a protocol stack conforming to at least one of the FF H1 bus and the HSE bus corresponding to the fieldbus;

a Virtual Field Device (VFD) object conforming to the FF standard specification, the VFD object including an AI block and an AO block that are function blocks conforming to the FF standard specification;

an analog/digital conversion unit provided between the first connection unit and the second connection unit, the analog/digital conversion unit bidirectionally converting a digital signal handled by the fieldbus to an analog signal handled by the first and second field devices and bidirectionally converting the analog signal handled by the first and second field devices to the digital signal handled by the fieldbus, wherein the method comprises:

reading a Primary Value (PV) of the first field device, which is the analogue signal, and converting the PV into a digital value;

receiving the digital value, which has been converted, and outputting digital data, which is a first calculation result in the AI block, to the fieldbus via the protocol stack;

receiving the digital data, which has been output to the fieldbus from other field devices including the third field device or a manipulation monitoring apparatus, via the protocol stack and outputting digital data which is a second calculation result in the AO block; and receiving the digital data which is the second calculation result, to convert the digital data into an analogue value, and to output the analogue value to the first field device, and wherein the analog/digital conversion unit is operative to communicate with and support field devices conforming to different ones of a plurality of standards.

7. The method of using a fieldbus adapter according to claim 6, wherein the fieldbus adaptor comprises a first connection unit detachably connected to the fieldbus and a second connection unit detachably connected to the field device, the conversion unit is provided between the first connection unit and the second connection unit, and the conversion unit bidirectionally converts the digital signal handled by the fieldbus and the analog signal handled by the field device.

8. The method of using a fieldbus adapter according to claim 6, wherein the analog signal is a signal of 4 to 20 mA.

9. The method of using a fieldbus adapter according to claim 6, wherein the fieldbus is a bus conforming to a FOUNDATION fieldbus.

10. The method of using a fieldbus adapter according to claim 6, wherein the conversion unit includes a function block application.

11. The method of using a fieldbus adapter according to claim 6, wherein the conversion unit is capable of supporting field devices conforming to a plurality of standards.

* * * * *